(12) United States Patent
Chang et al.

(10) Patent No.: US 12,009,027 B2
(45) Date of Patent: Jun. 11, 2024

(54) REFRESH OF NEIGHBORING MEMORY CELLS BASED ON READ STATUS

(71) Applicant: Micron Technology, Inc., Boise, ID (US)

(72) Inventors: Li-Te Chang, San Jose, CA (US); Murong Lang, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 159 days.

(21) Appl. No.: 17/561,340

(22) Filed: Dec. 23, 2021

(65) Prior Publication Data

US 2023/0207003 A1 Jun. 29, 2023

(51) Int. Cl.
*G11C 13/00* (2006.01)
*G11C 11/56* (2006.01)

(52) U.S. Cl.
CPC ...... *G11C 13/0033* (2013.01); *G11C 13/0004* (2013.01); *G11C 13/004* (2013.01); *G11C 13/0069* (2013.01); *G11C 11/5678* (2013.01)

(58) Field of Classification Search
CPC ... G06F 11/10; G11C 13/0033; G11C 13/004; G11C 13/0069; G11C 13/0004; G11C 16/3418; G11C 7/04; G11C 16/3427; G11C 11/5678; G11C 2013/0054
See application file for complete search history.

(56) References Cited

U.S. PATENT DOCUMENTS

| | | | | |
|---|---|---|---|---|
| 9,070,473 B2* | 6/2015 | Bedeschi | ............ | G11C 13/0033 |
| 9,336,843 B2 | 5/2016 | Bedeschi | | |
| 10,083,744 B2 | 9/2018 | Bolandrina et al. | | |
| 10,600,480 B2* | 3/2020 | Mirichigni | ......... | G11C 13/0004 |
| 2006/0280012 A1* | 12/2006 | Perner | ...................... | G11C 7/04 |
| | | | | 365/222 |
| 2008/0117663 A1* | 5/2008 | Philipp | .............. | G11C 13/0004 |
| | | | | 365/148 |
| 2010/0321987 A1* | 12/2010 | Lung | .................. | G11C 13/0069 |
| | | | | 365/207 |
| 2012/0063196 A1* | 3/2012 | Kim | ...................... | G11C 29/021 |
| | | | | 365/148 |
| 2015/0095560 A1* | 4/2015 | Bedeschi | .............. | G11C 13/004 |
| | | | | 711/103 |
| 2020/0066342 A1* | 2/2020 | Ha | ...................... | G11C 13/0004 |
| 2021/0358546 A1* | 11/2021 | Sinipete | ............. | G11C 13/0097 |

\* cited by examiner

*Primary Examiner* — Tuan T Nguyen
(74) *Attorney, Agent, or Firm* — Greenberg Traurig

(57) ABSTRACT

Systems, methods, and apparatus related to memory devices. In one approach, a cross-point memory array includes memory cells. A media controller reads one or more first memory cells and determines a read status. The read status indicates an error when reading the first memory cells. In response to this error, the controller refreshes the first memory cells. The controller uses the read status to determine zero-to-one failures associated with the first memory cells. If a number of these failures exceeds a threshold, then a refresh is applied to neighboring memory cells of the first memory cells. The physical addresses for the neighboring memory cells are determined by the controller from the physical addresses for the first memory cells.

22 Claims, 6 Drawing Sheets

| Cell | BL# | WL# |
|---|---|---|
| C | N | N |
| V1 | N-2 | N |
| V2 | N-1 | N+1 |
| V3 | N | N+2 |
| V4 | N+1 | N+1 |
| V5 | N+2 | N |
| V6 | N+1 | N-1 |
| V7 | N | N-2 |
| V8 | N-1 | N-1 |

FIG. 4

REFRESH OF NEIGHBORING MEMORY CELLS BASED ON READ STATUS

FIELD OF THE TECHNOLOGY

At least some embodiments disclosed herein relate to memory devices in general, and more particularly, but not limited to determining a read status for one or more memory cells in a memory device, and refreshing one or more neighboring memory cells based on the read status.

BACKGROUND

Memory devices may be employed in various electronic devices, such as computers, cell phones, PDAs, data loggers, or navigational equipment, just to name a few examples. For example, various types of nonvolatile memory devices may be employed, such as solid state drives (SSDs), NAND or NOR flash memory, or phase change memory, among others. In general, writing or programming operations may be used to store information, while read operations may be used to retrieve stored information.

Phase change memory (PCM) may operate based, at least in part, on behavior and properties of one or more particular phase change materials, such as chalcogenide alloy and/or germanium antimony telluride (GST), just to name a few examples. Crystalline and amorphous states of such materials may have different electrical resistivities, thus presenting a basis by which information may be stored. The amorphous, high resistance state may represent a stored first binary state and the crystalline, low resistance state may represent a stored second binary state. Of course, such a binary representation of stored information is merely an example. Phase change memory may also be used to store multiple memory states, represented by varying degrees of phase change material resistivity, for example.

A PCM memory cell may transition from an amorphous state to a crystalline state by applying a bias signal to the memory cell. Characteristics of a bias signal, such as peak magnitude and/or pulse width, for example, may be selected to allow a transition to a crystalline state.

Nonvolatile memory devices, such as PCM, may comprise wordlines and bitlines to program an array of memory cells. As the density of memory cells in an array increases, distances between adjacent wordlines or bitlines may decrease. Decreased spacing among wordlines or bitlines may lead to undesirable effects, such as capacitive coupling, crosstalk, or proximity-disturb, just to name a few examples.

Firmware can be used to operate a memory controller for a particular memory device. In one example, when a computer system or server reads data from or writes data to a memory device, it communicates with the memory controller.

In one example, reading a set of data (e.g., a codeword, a page) is carried out by determining a read voltage (e.g., an estimated median of threshold voltages) of memory cells that store the set of data. In some cases, a memory device may include an array of PCM cells arranged in a 3D architecture, such as a cross-point architecture to store the set of data. PCM cells in a cross-point architecture may represent a first logic state (e.g., a logic 1, a SET state) associated with a first set of threshold voltages, or a second logic state (e.g., a logic 0, a RESET state) associated with a second set of threshold voltages. In some cases, data may be stored using encoding (e.g., error correction coding (ECC)) to recover data from errors in the data stored in the memory cells.

For resistance variable memory cells (e.g., PCM cells), one of a number of states (e.g., resistance states) can be set. For example, a single level cell (SLC) may be programmed to one of two states (e.g., logic 1 or 0), which can depend on whether the cell is programmed to a resistance above or below a particular level. As an additional example, various resistance variable memory cells can be programmed to one of multiple different states corresponding to multiple data states, e.g., 10, 01, 00, 11, 111, 101, 100, 1010, 1111, 0101, 0001, etc. Such cells may be referred to as multi-state cells, multi-digit cells, and/or multilevel cells (MLCs).

The state of a resistance variable memory cell can be determined (e.g., read) by sensing current through the cell responsive to an applied interrogation voltage. The sensed current, which varies based on the resistance of the cell, can indicate the state of the cell (e.g., the binary data stored by the cell). The resistance of a programmed resistance variable memory cell can drift (e.g., shift) over time. Resistance drift can result in erroneous sensing of a resistance variable memory cell (e.g., a determination that the cell is in a state other than that to which it was programmed, among other issues).

As indicated above, a PCM cell, for example, may be programmed to a reset state (amorphous state) or a set state (crystalline state). A reset pulse (e.g., a pulse used to program a cell to a reset state) can include a relatively high current pulse applied to the cell for a relatively short period of time such that the phase change material of the cell melts and rapidly cools, resulting in a relatively small amount of crystallization. Conversely, a set pulse (e.g., a pulse used to program a cell to a set state) can include a relatively lower current pulse applied to the cell for a relatively longer time interval and with a slower quenching speed, which results in an increased crystallization of the phase change material.

A programming signal can be applied to a selected memory cell to program the cell to a target state. A read signal can be applied to a selected memory cell to read the cell (e.g., to determine the state of the cell). The programming signal and the read signal can be current and/or voltage pulses, for example.

BRIEF DESCRIPTION OF THE DRAWINGS

The embodiments are illustrated by way of example and not limitation in the figures of the accompanying drawings in which like references indicate similar elements.

FIG. 1 shows an example of wordline and bitline positions in a memory array of victim memory cells relative to the position of an aggressor memory cell in the array, in accordance with some embodiments.

FIG. 2 shows a memory device that refreshes neighboring memory cells in a memory array based on comparing a read status of a selected memory cell to threshold criteria stored in the memory device, in accordance with some embodiments.

FIG. 3 shows a proximity map of potential aggressor and victim memory cells relative to a center cell determined to have a number of errors exceeding a threshold criteria, in accordance with some embodiments.

FIG. 4 shows an address mapping to determine physical addresses of potential victim memory cells relative to the physical address of a center cell identified as having a high number of errors, in accordance with some embodiments.

FIG. 5 shows a process for refreshing a selected memory cell or unit in a memory device based on a read status, followed by a process for refreshing neighboring memory cells or units based on a threshold number of errors in reading the selected cell/unit, in accordance with some embodiments.

Figure 6:
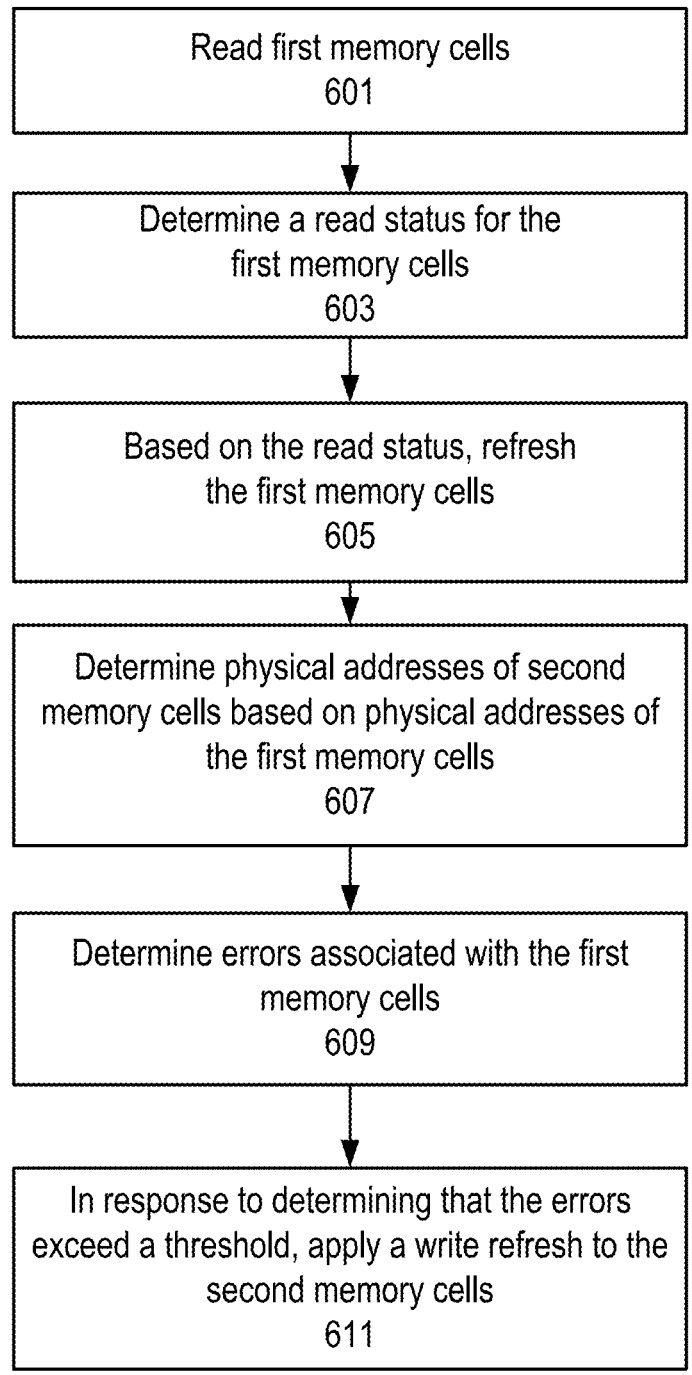

FIG. 6 shows a method for applying a write refresh to neighboring memory cells in response to determining that a number of read errors exceeds a threshold, in accordance with some embodiments.

DETAILED DESCRIPTION

The following disclosure describes various embodiments for determining a read status for one or more memory cells in a memory device, and refreshing one or more neighboring memory cells based on the read status. The memory device may, for example, store data used by a host device (e.g., a computing device of an autonomous vehicle, or another computing device that stores and/or accesses data in the memory device). In one example, the memory device is a solid-state drive mounted in an electric vehicle.

When a memory cell in a memory array is programmed, voltage waveforms are applied to a target memory cell to be programmed. The target memory cell is sometimes referred to as an aggressor cell (or simply aggressor) because the programming operation for the aggressor can cause thermal damage to occur in neighboring cells near the aggressor. The thermal damage may occur, for example, due to thermal heat generated by current flow when programming the aggressor cell. The neighboring cells that may be potentially damaged are sometimes referred to as victim cells (or simply victims). The thermal damage caused is sometimes referred to as proximity disturb.

In cross-point memory arrays, proximity disturb is a significant reliability issue. The proximity disturb is due to thermal disturb between aggressor and adjacent victim cells. A typical write operation requires passing a large current through the aggressor (e.g., a storage media cell). The generated heat is used to crystalize or quench the storage media cell for set or reset states, respectively. However, the heat dissipates into adjacent victim cells, and can make adjacent cells crystallized as well. As a result, the threshold voltage (Vt) of the adjacent cells is modified. In one example, the result is the formation of E3 tails that cause zero-to-one (Z2O) failures for the victim cells.

Figure 1:
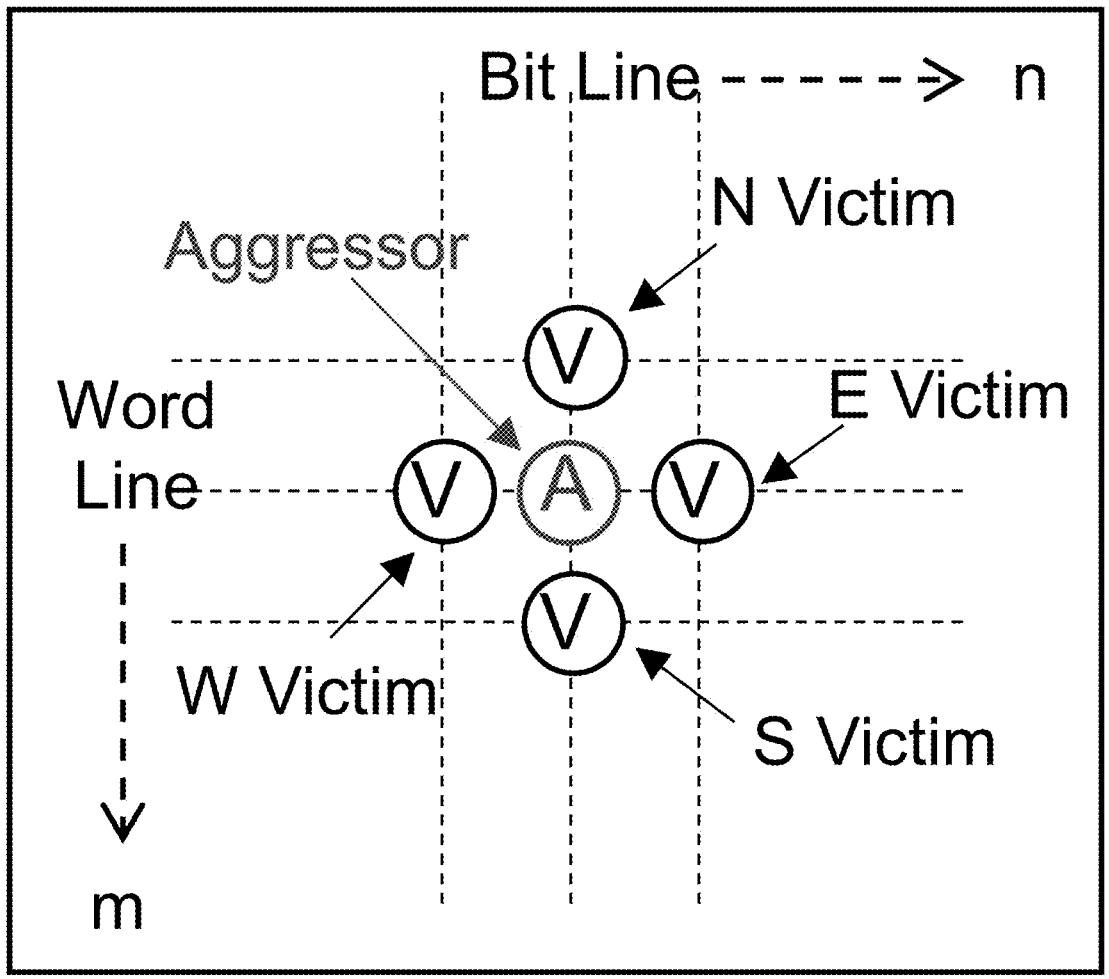

FIG. 1 shows an example of bitline and wordline positions (n, m) in a memory array of victim memory cells relative to the position of an aggressor memory cell in the array, in accordance with some embodiments. More specifically, an aggressor cell is shown at a central position (indicated by A). Victim cells (indicated as V for N, E, S, W victim cells) are shown at positions adjacent to the aggressor cell.

In some cases, proximity disturb handling is implemented by a media controller of a memory device in an attempt to remedy proximity disturb. Once proximity disturb handling is triggered, the media controller first interrupts firmware, and reports a physical memory unit (MU(s)) address to the firmware. The firmware calculates a neighboring MU(s) address, and issues an MU refresh (e.g., read followed by a write) to these neighboring MU(s).

There are two existing approaches for triggering this proximity handling: periodic and random. In an example of the periodic approach, every MU write increments a corresponding counter (e.g., SMU-write-count) by one. Once the accumulated SMU-write-count reaches a multiple of a threshold (e.g., SMU-write-count mod PD_THRHD=0), proximity disturb handling is triggered.

In an example of the random approach, a random number is generated with every MU write. Proximity disturb handling is triggered if the random number is a multiple of a threshold (e.g., random number mod PD_THRHD=0).

However, both of the two approaches above present technical problems. In particular, proximity disturb handling is triggered by write counts only at the memory unit (MU) or super memory unit (SMU) level. This makes it poorly suited for handling die-to-die variation.

For example, in the above proximity disturb handling, write refresh is applied when SMU-write-count mod PD_THRHD=0. In other words, the proximity disturb handling is dependent on a fixed setting of a proximity disturb threshold, and therefore it is difficult to properly handle drive-to-drive variation.

As another specific example of technical problems that can occur due to thermal disturb in memory devices, a cross-point memory array comprising PCM cells may be programmed using wordlines or bitlines that provide electrical programming pulses or signals representing one-bits or zero-bits (also referred to as zero states or one states) in individual PCM cells. While one wordline may be used to program one row of PCM cells, an adjacent wordline may be used to program an adjacent row of PCM cells. Adjacent rows of PCM cells may be spaced apart to provide structural, electrical, or thermal insulation between the adjacent rows. However, as the density of PCM cells in an array increase, spacing between adjacent rows of PCM cells may decrease, thus reducing the amount of available semiconductor material providing thermal insulation between the adjacent rows.

Among other things, thermal contact among PCM cells may undesirably lead to an increased likelihood that a state of one PCM cell may be disturbed by the state of a neighboring PCM cell. A PCM cell thermally affecting a state of another PCM cell may be called a proximity-disturb event, which may include a program disturb event or a read disturb (e.g., fast read disturb) event, depending on whether a program process or a read process is involved. For example, a zero-bit of a PCM cell may be cyclically re-programmed with a particular frequency in a process of refreshing the state of the PCM cell. Such re-programming a zero-bit may comprise applying a relatively high amplitude electrical programming pulse or signal so as to melt and then cool phase change material of the PCM cell. A process of melting phase change material of the PCM cell, however, may inadvertently add heat to one or more neighboring PCM cells. A neighboring PCM cell nearest the re-programmed PCM cell may be affected more than other neighboring PCM cells.

In one implementation, a neighboring PCM cell nearest the re-programmed PCM cell may be located in a wordline adjacent to a wordline of the re-programmed PCM cell. Thus, a neighboring PCM cell located in a wordline adjacent to a wordline of the re-programmed PCM cell may be program-disturbed by the re-programming process of the neighboring PCM cell. As the frequency or number of times of refreshing the state of a PCM cell increases, so may the likelihood of occurrence of a program-disturb event, induced by increasing ambient temperatures of a memory array, for example.

PCM cells in a zero-bit, amorphous state may be more susceptible to effects of a program-disturb event compared to PCM cells in a one-bit, crystalline state. Such effects may change a PCM memory cell in a zero-bit state to a one-bit state or vice versa. For example, a program-disturb event may erroneously change a state of a PCM cell from a zero-bit state to a one-bit state. This may be true, at least in part, because an amorphous state may comprise a meta-stable state with respect to a relatively stable crystalline state. Additional energy applied to such an amorphous state (via thermal or electrical energy, for example) may accelerate a crystallization process. Such additional energy may comprise ambient thermal energy from neighboring PCM cells being repeatedly programmed. In this case, heat generated during programming operation of neighboring PCM cells may diffuse from the neighboring PCM cells to accelerate crystallization of another PCM cell in a zero-bit, amorphous state. In another implementation, a read-disturb event may occur if a PCM cell is read many times during a relatively short period of time to create excess heat.

To address all of the above and other technical problems, a memory device determines whether a read status from one or more memory cells that are read by a controller indicates that a number of read errors from reading the cells exceeds a threshold criteria. If so, then the controller applies a refresh to a certain pre-defined number of cells that are neighbors to the selected memory cells (e.g., 2-8 potential victim cells).

In one embodiment, the read memory cell is at an bitline address of N and a wordline address of N. Physical addresses for victim cells are determined based on offsets from the physical address for the read memory cell. In one embodiment, the threshold criteria is a function of temperature. Examples of potential victim cells are a first cell at a bitline address of N−2 and a wordline address of N, and a second cell at a bitline address of N−1 and a wordline address of N+1. Additional examples of address mapping for victim cells are illustrated in FIG. 4 below.

In one embodiment, a memory device includes a cross-point memory array having memory cells. A controller is configured to read one or more first memory cells (e.g., a memory unit (MU)), and determine a read status for the first memory cells. In response to determining the read status (e.g., the read status indicates that a read error occurred), the controller refreshes the first memory cells. The controller also determines other errors (e.g., Z2O failures) associated with the first memory cells.

The controller determines, based on the errors, whether at least one threshold failure criterion is satisfied. If so, the controller determines physical addresses for one or more second memory cells using offsets from the physical addresses of the first memory cells. Then, the controller applies a write refresh to the second memory cells. In one example, the mapping to the second memory cells is as illustrated in FIG. 4.

Various advantages are provided by the embodiments described herein. In one example, the controller can apply write refresh to a corresponding MU (e.g., first memory cells above) and its neighboring MUs (e.g., second memory cells above) based on the read status. The controller applies write refresh, for example only when zero-to-one (Z2O) failures show a high risk of thermal disturb. In this way, the refresh frequency is optimized based on the actual workload of the storage media (e.g., cross-point memory array).

In one example, the refresh frequency is based on a read status of the memory units (MUs) of each solid-state drive. Some drives will show worse thermal disturb due to less E3 margin. The refresh approach for potential victim cells as described herein mitigates drive-to-drive variation and improves memory device reliability.

Figure 2:
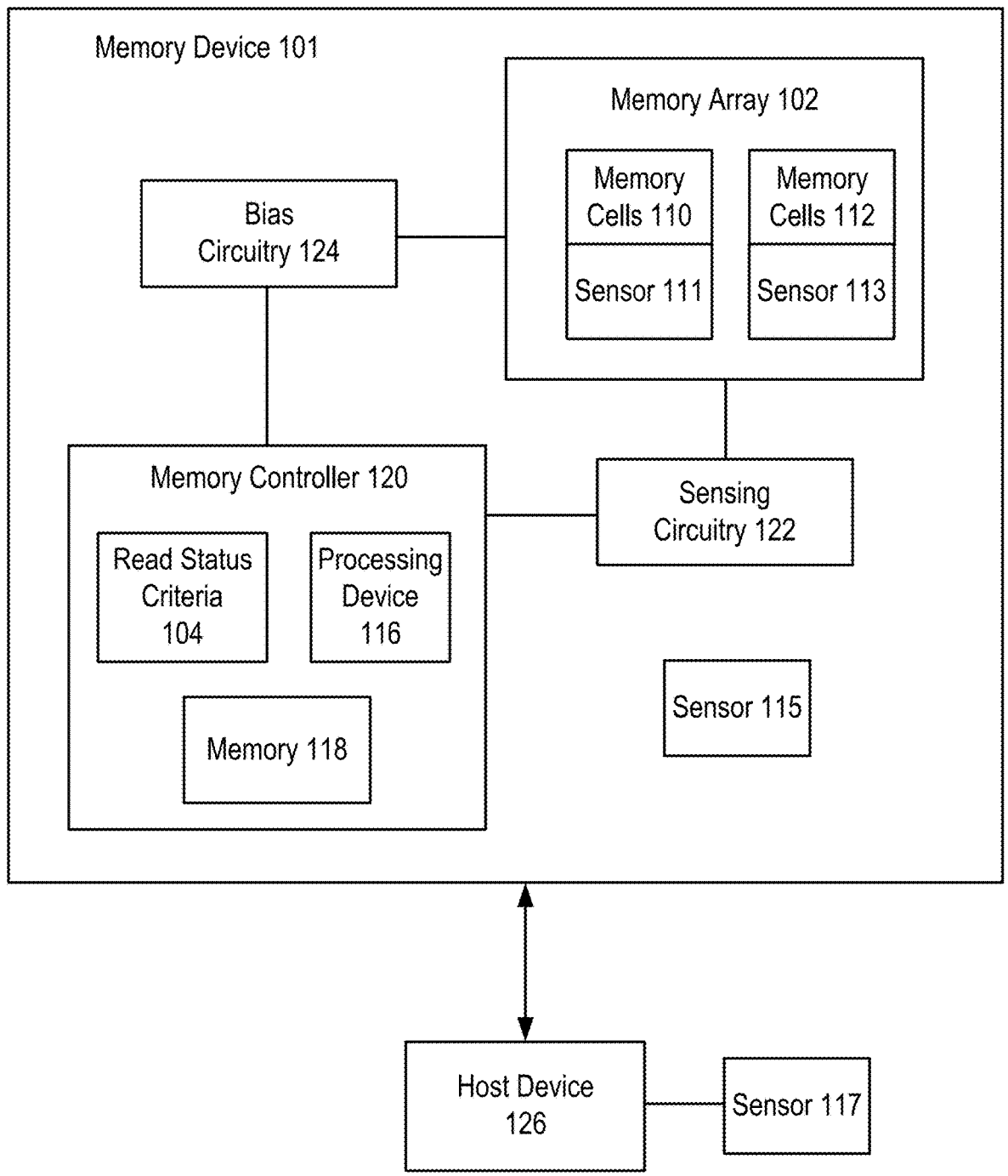

FIG. 2 shows a memory device 101 that refreshes neighboring memory cells in a memory array 102 based on comparing a read status of a selected memory cell to threshold criteria stored in the memory device, in accordance with some embodiments.

During operation, memory device 101 applies one or more voltages to memory cells 110, 112 of memory array 102 (e.g., when performing write operations). Memory device 101 has a memory controller 120 (e.g., a media controller) that controls the applying of the voltages. Memory controller 120 includes one or more processing devices 116 and memory 118. In one example, memory 118 stores firmware executed by processing device 116 (e.g., to apply the voltages).

Memory controller 120 can use bias circuitry 124 to generate the applied voltages. In one example, bias circuitry 124 generates write voltages for applying to memory cells 110, 112 as part of programming operations. Bias circuitry 124 may further be used to generate read voltages for read operations performed on memory array 102 (e.g., in response to a read command from host device 126).

Memory device 101 includes sensing circuitry 122, which is used to sense a state of each memory cell in memory array 102. In one example, sensing circuitry 122 includes sense amplifiers used to detect a current caused by applying various voltages to memory cells in memory array 102. In one example, bias circuitry 124 applies a read voltage to memory cells 110. Sensing circuitry 122 senses a current associated with each of the memory cells 110 caused by applying the read voltage.

In one example, if sensing circuitry 122 determines that the current for a memory cell is greater than a fixed threshold (e.g., a predetermined level of current), then memory controller 120 determines a logic state for the memory cell.

In one embodiment, memory controller 120 receives a write command from a host device 126. The write command is accompanied by data (e.g., user data of a user of host device 126) to be written to memory array 102. In response to receiving the write command, controller 120 initiates a programming operation by applying a voltage waveform to memory cells 110.

In one embodiment, controller 120 stores read status criteria 104. As controller 120 reads certain memory cells in memory array 102, controller determines a read status for the read memory cells. In one example, the read status is one or more errors in reading data from one or more memory cells (e.g., certain bits fail to decode properly). Controller 120 compares the read status to the read status criteria 104 to make decisions regarding further processing. Examples of further processing may include correcting the error(s) prior to sending the data to host device 126, refreshing the memory cells that have been identified as having failed to provide correct data, and/or performing a refresh operation on memory cells that are neighbors of the read cells for which the read status was determined.

In one example, controller 120 determines the particular cells of memory cells 110 for which a write voltage is to be applied. In one example, the write voltage is 3-8 volts applied across the memory cell by applying voltage biases to the wordline and bitline used to select the cell. In one example, in the case of a chalcogenide memory cell, a write voltage of a first polarity is applied to program the cell to a first logic state (e.g., set state), and a write voltage of a second opposite polarity is applied to program the cell to a second, different logic state (e.g., reset state).

In one example, controller 120 may use write voltages (e.g., write pulses) to write a logic state to a memory cell, such as memory cell 110, 112 during a write operation. The write pulses may be applied by providing a first voltage to a bit line and providing a second voltage to a word line to select the memory cell. Circuits coupled to access lines to which memory cells may be coupled may be used to provide the write voltages (e.g., access line drivers included in decoder circuits). The circuits may be controlled by internal control signals provided by a control logic (e.g., controller 120). The resulting voltage applied to the memory cell is the difference between the first and second voltages. The write pulses may be the same duration as read pulses in some embodiments. In some embodiments the duration is 10-50 ns. In some embodiments, the duration is 1-100 ns. In some embodiments, the duration is 1 ns to 1 microsecond. Writing to the memory cell may take the same time duration as reading the memory cell in some embodiments.

In one example, the polarity of the write pulses may be either a first polarity or a second polarity (e.g., forward or reverse). For example, a write pulse may apply a voltage to a memory cell in a first polarity (e.g., bit line at 6V and word line at 0V).

In one example, circuits coupled to access lines to which memory cells may be coupled are used to provide read pulses (e.g., access line drivers included in decoder circuits). The circuits may be controlled by internal control signals provided by a control logic (e.g., controller 120). A read voltage or pulse may be a voltage applied to a memory cell for a period of time (e.g., 10-50 ns, 1-100 ns, 1 ns to 1 microsecond). In some embodiments, the read pulse may be a square pulse. In some embodiments, the read pulse may be a ramp, that is, a linearly-increasing voltage may be applied across the memory cell.

In one example, after being accessed (e.g., selected), a memory cell may be read, or sensed, by a sense component (e.g., sensing circuitry 122) to determine the stored state of the memory cell. For example, a voltage may be applied to the memory cell (using a wordline and bitline) and the presence of a resulting current may depend on the applied voltage and the threshold voltage of the memory cell. In some cases, more than one voltage may be applied. Additionally, if an applied voltage does not result in current flow, other voltages may be applied until a current is detected by the sense component. By assessing the voltage that resulted in current flow, the stored logic state of the memory cell may be determined. In some cases, the voltage may be ramped up in magnitude until a current flow is detected (e.g., a memory cell turns on, switches on, conducts current, or becomes activated). In other cases, predetermined voltages may be applied sequentially until a current is detected. Likewise, a current may be applied to a memory cell, and the magnitude of the voltage to create the current may depend on the electrical resistance or the threshold voltage of the memory cell.

In some cases, the memory cell (e.g., a PCM cell) includes a material that changes its crystallographic configuration (e.g., between a crystalline phase and an amorphous phase), which in turn, determines a threshold voltage of the memory cell to store information. In other cases, the memory cell includes a material that remains in a crystallographic configuration (e.g., an amorphous phase) that may exhibit variable threshold voltages to store information.

The sense component may include various transistors or amplifiers in order to detect and amplify a difference in the signals. The detected logic state of the memory cell may then be output through a column decoder as output. In some cases, the sense component may be part of a column decoder or a row decoder.

Memory device 101 includes sensors 111, 113, 115, which provide temperature data for controller 120. Read status criteria 104 includes one or more thresholds that are compared to a number of read errors associated with reading memory cells in memory array 102. In one embodiment, these thresholds are a function of temperature. Controller 120 uses the temperature data to adjust one or more other thresholds in real-time as memory cells in memory array 102 are read and a read status is determined.

In one embodiment, sensors 111, 113 are each positioned in a different location are portion of memory array 102. In one example, sensors 111, 113 each provide a die temperature for a different location on the die on which memory array 102 is formed. In one example, sensor 115 is positioned inside a package of memory device 101 that also includes memory controller 120 and memory array 102. In one example, sensor 115 is on the same die is memory controller 120.

In one embodiment, host device 126 receives temperature data from sensor 117. Host device 126 sends the temperature data and/or a signal derived from the temperature data to the controller 120, which is used by controller 120 to adjust one or more of the above thresholds of read status criteria 104. In one example, sensor 117 is included in host device 126. In one example, sensor 117 is mounted in a vehicle in which host device 126 is configured. In one example, host device 126 controls one or more components of the vehicle, such as navigation or engine control.

In one example, memory array 102 is a cross-point memory array. Memory devices may utilize cross-point arrays to efficiently store and retrieve data. The cross-point arrays can include multiple memory cells, such as thousands of memory cells, arranged in an array structure. Memory cells can be selected from the cross-point arrays by applying voltages to bitline conductors and wordline conductors corresponding to individual memory cells. A selected memory cell may then be accessed by an access circuit associated with the memory cell.

As the size of cross-point arrays decrease due to improvements in technology, the distance between neighboring access line conductors of the memory arrays also decreases, increasing coupling capacitances between the neighboring access line conductors. With greater amounts of coupling capacitances between the neighboring access line conductors, current and voltage pulses used to select memory cells can disturb neighboring memory cells in a memory array and thus reduce the reliability of the neighboring memory cells and the memory array as a whole.

In one example, memory array 102 generally may be formed on a substrate. Examples of substrates include silicon-on-insulator (SOI) or silicon-on-sapphire (SOS) technology, doped and undoped semiconductors, epitaxial layers of silicon supported by a base semiconductor foundation, complementary metal oxide semiconductors (CMOS), for example, a CMOS front end with a metal back end, and/or other semiconductor structures and technologies. Various circuitry, such as decode circuitry, for example, associated with operating memory array may be formed in and/or on the substrate.

As an example, memory cells 110, 112 may include phase change random access memory (PCRAM) cells, and resistive random access memory (RRAM) cells, among other types of memory cells. In various embodiments, memory cells may comprise a stack structure that includes a select device, for example, a switching device, coupled in series to a storage component, for example, a resistive storage component comprising a phase change material or metal oxide. As an example, the select device may comprise a diode, a field effect transistor (FET), among other switching elements.

Figure 3:
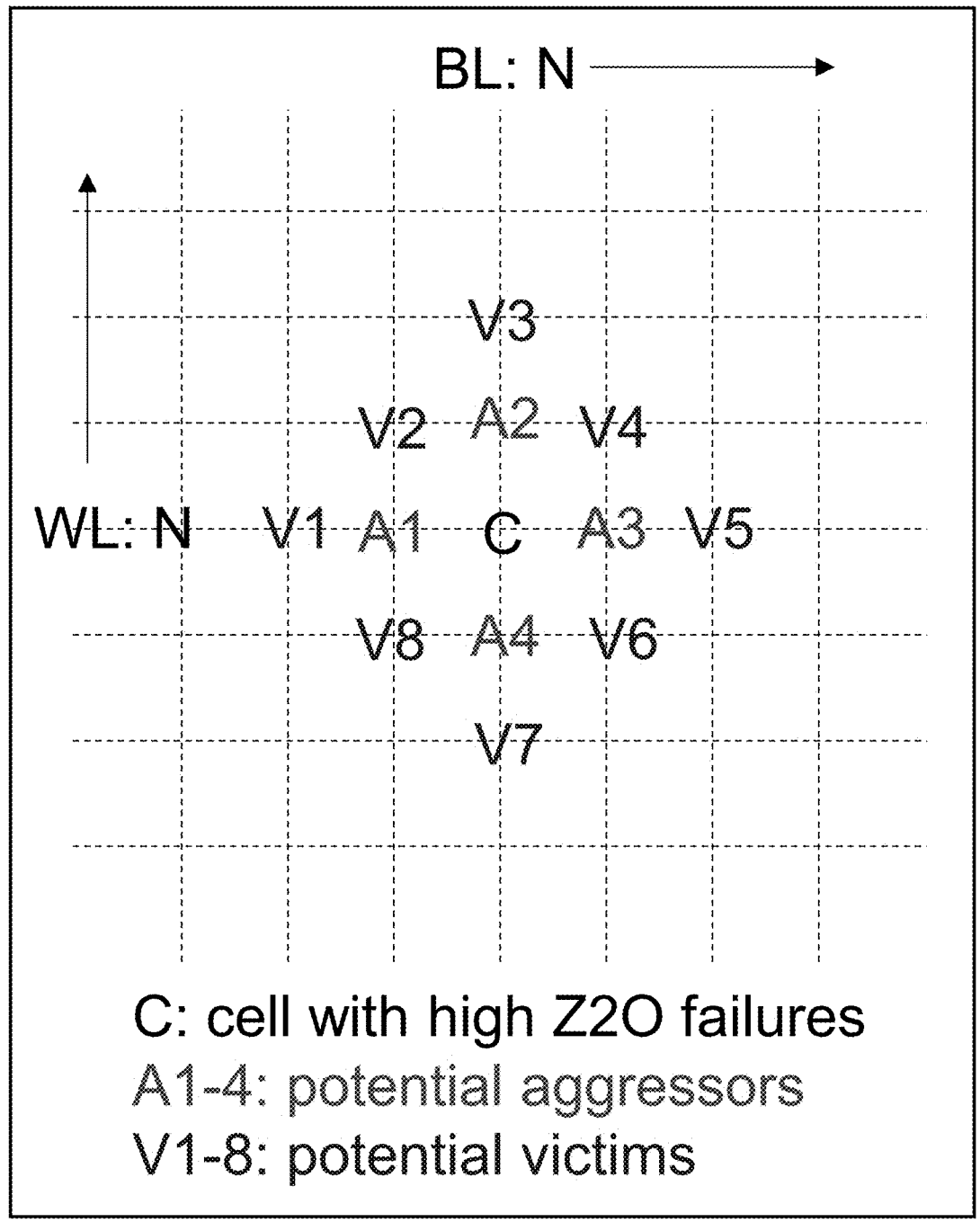

FIG. 3 shows a proximity map of potential aggressor and victim memory cells relative to a center cell (indicated as cell "C" in FIG. 3) determined to have a number of errors exceeding a threshold criteria, in accordance with some embodiments. The center cell is selected and has been read by a media controller. In one example controller 120 reads center memory cell C.

When reading the center cell, the controller determines read status data for the cell. The read status data includes a number of errors associated with reading the center cell. In one example, the read status data includes data regarding zero-to-one (Z2O) failures for the center cell. In one example, the controller determines that a number of failures for the center cell over a given number of read operations (e.g., the last 20 reads). If the number of failures is greater than a threshold number, then the controller determines that one or more neighboring victim cells should be refreshed.

In one example, if the controller determines that the read status from the center cell C (at physical address bitline N, wordline N) has a number of zero-to-one failures that are above a threshold number, then the center cell may have been disturbed by cells at relative addresses N+1 or N−1 (potential aggressors A1-A4). In this case, the controller determines to apply refresh to cells at relative addresses N+2 and N−2 (potential victims V1-V8).

To make more efficient use of resources, there are two levels of refresh corresponding to a lower threshold and a higher threshold. Additional levels of thresholds may be used in other embodiments. If Z2O failures are above the lower threshold, but below the higher threshold, the controller applies refresh only to dominant neighboring cells (V1 and V5). In one example, these dominant neighbors are on the same wordline as center cell C. If Z2O failures are above the higher threshold, the controller applies refresh to all neighbors (V1-V8).

In one embodiment, when a number of Z2O failures for a read center cell is larger than a threshold criteria a, it indicates or corresponds to formation of an E3 tail and a loss of E3 margin. In this case, firmware of the controller issues a write refresh to neighboring memory cells.

In one example, the neighboring memory cells are certain cells in one or more memory units (MUs) or super memory units (SMUs). In one example, each memory unit (MU) may contain hundreds to thousands of cells (e.g., more than 100-500 cells). In one example, each SMU may contain 10,000 cells or more.

In one embodiment, the lower and/or higher thresholds are a function of temperature (e.g., die temperature). For example, when the die temperature is higher than a threshold criteria P, a higher risk of thermal disturb is expected. In this case the lower and/or higher thresholds are adjusted to a lower value(s) to trigger more write refresh events from reading the center cell C.

In one example, the potential victim memory cells are in the same layer or plane of a memory array. In one example, the potential victim memory cells may include cells that are in a layer or plane above and/or below the plane of cell C.

As mentioned in the specific example above, thermal contact among PCM cells may lead to a program-disturb event, wherein a state of one PCM cell may be disturbed by the state of a neighboring PCM cell. A neighboring PCM cell nearest the re-programmed PCM cell may be affected more than other neighboring PCM cells. In one implementation, a neighboring PCM cell nearest the re-programmed PCM cell may be located in a wordline adjacent to a wordline of the re-programmed PCM cell. Thus, a neighboring PCM cell located in a wordline adjacent to a wordline of the re-programmed PCM cell may be program-disturbed by the re-programming process of the neighboring PCM cell. In a memory array, for example, memory cells included in word-lines of a wordline pair may be physically near one another so as to be affected by a program-disturb event.

More specifically, memory cells included in wordlines of a wordline pair along a same bitline may be physically near enough to one another so as to be affected by a program-disturb event. On the other hand, memory cells included in wordlines of different wordline pairs, even if on a same bitline, may be physically separated enough so as to not be substantially affected by a program-disturb event.

As discussed in the specific example above, PCM cells in a zero-bit, amorphous state may be more susceptible to effects of a program-disturb event compared to PCM cells in a one-bit, crystalline state. For example, memory cells in zero-bit states in one memory cell pair may program-disturb one another.

In one implementation, PCM cells in adjacent wordlines of wordline pairs may be more susceptible to effects of a program-disturb event compared to PCM cells in a same wordline and adjacent bitlines. Such effects may change a PCM memory cell in a zero-bit state to a one-bit state or vice versa.

FIG. 4 shows an address mapping to determine physical addresses of potential victim memory cells relative to the physical address of a center cell identified as having a high number of errors, in accordance with some embodiments. In one embodiment, a controller (e.g., controller 120) stores a physical address for a memory cell that is being read and for which a read status is determined. In one example, this memory cell is center cell C, and potential victim cells are cells V1-V8, as illustrated in FIG. 4. In one example, the center cell C is cell C of FIG. 3.

The controller uses the cell C physical address (bitline (BL) number or address N, wordline (WL) number or address N) and adds or subtracts an offset value as indicated in FIG. 4 for certain of the bitline or wordline addresses to determine the victim cell's physical address. For some bitline or wordline addresses, the address for the victim is the same as the center cell. For example, the bitline number or address for a potential victim V1 has a value of 2 subtracted from the center cell bitline address, but the wordline number or address is the same. In other embodiments, a different address mapping scheme can be used.

In one embodiment, neighboring memory cells are determined for two or more center cells (e.g., 5-30 center cells in an MU) that are associated with a high number of errors. In one example, the center cells are in a memory unit (MU), for which a high number of Z2O failures (e.g., more than 2 failures of reading a cell over the last 100 reads of the cell) has been determined from read status data. The mapping shown in FIG. 4 is applied to each respective center cell in the MU to identify neighboring memory cells for each respective center cell.

Figure 5:
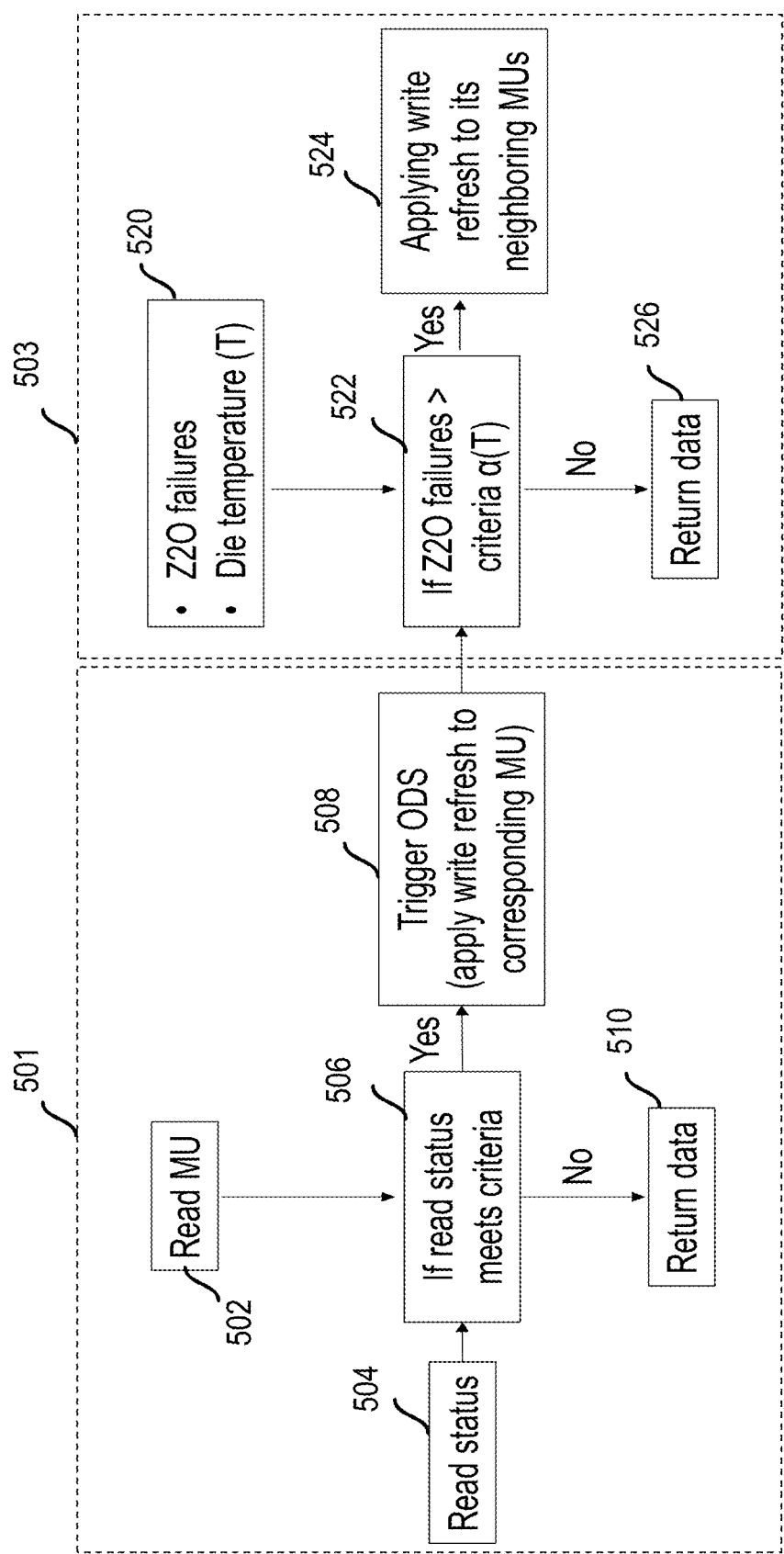

FIG. 5 shows a process 501 for refreshing a selected memory cell or unit in a memory device based on a read status, followed by a process 503 for refreshing neighboring memory cells or units based on a threshold number of errors in reading the selected cell/unit, in accordance with some embodiments. In block 502, a memory cell(s) or memory unit (MU) is read as part of a read operation implemented by a controller of a memory device. The read operation may be performed, for example, in response to read command received from a host device. In one example, the memory cell is one of memory cells 110, 112. In one example, the controller is controller 120. In one example, the memory cell being read is memory cell C of FIG. 3 or FIG. 4.

In block 504, the controller obtains a read status for the memory cell or unit that has been read. In block 506, the read status data is compared against criteria. In one example, the criteria is whether an error has occurred in reading data from the memory cell. In one example, the criteria is associated with a performance of the memory cell during the read operation. In one example, the criteria is associated with a voltage and/or current characteristic determined for the memory cell.

In block 508, if the read status data meets the criteria, then the controller determines that there is a problem or deficiency associated with the read memory cell. The meeting of the criteria triggers a refresh operation. In one example, the refresh operation is an on-demand scrub. In one example, a write refresh is applied to the memory cell or unit that has been read and found to have a read error, or performance deficiency/problem.

In block 510, if the read status does not meet any criteria associated with triggering a refresh, then the read data is returned to the requesting device. In one example, the read data is returned to host device 126.

In block 520, a number of errors (e.g., of a defined error type) (e.g., a different type of error than used in block 506) associated with reading the memory cell or unit in block 502 is determined by the controller. The controller also determines a temperature. In one example, the temperature is a die temperature.

In block 522, the controller compares a number of errors associated with reading the memory cell or unit to one or more criteria. In one example, the criteria includes a lower threshold and a higher threshold, as discussed above. In one example, the number of errors is a number of zero-to-one failures. Other types of errors may be used additionally and/or alternatively.

In block 522, criteria $\alpha(T)$ is a threshold(s) that is a function of temperature (e.g., die temperature). For example, $\alpha$ is reduced by 10% if the temperature has increased by 5 degrees Celsius (° C.). In one example, the lower and higher thresholds above are each a function of temperature. In one example, the lower and higher thresholds use a different function of temperature (e.g., the lower threshold varies by a differing absolute or percentage amount than the higher threshold varies for a given change in temperature).

It should be noted that although process 503 is illustrated as following process 501, in other embodiments, process 503 can be implemented independently of process 501. In other words, a need for a write refresh for neighboring cells can be determined and applied without the need to apply a write refresh to the read cell (e.g., read cell of block 502).

In block 524, if the errors satisfy the one or more criteria, then a write refresh is applied to neighboring cells relative to the memory cell or unit read in block 502. In one example, the neighboring cells are cells V1 and V5, or V1-V8 of FIG. 3.

In block 526, if the errors do not satisfy any criteria in block 522, then the read data is returned to the requesting device. In one example, the requesting device is host device 126.

FIG. 6 shows a method for applying a write refresh to neighboring memory cells in response to determining that a number of read errors exceeds a threshold, in accordance with some embodiments. For example, the method of FIG. 6 can be implemented in memory device 101 of FIG. 2.

The method of FIG. 6 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 6 is performed at least in part by one or more processing devices (e.g., controller 120 of FIG. 2).

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 601, first memory cells are read. In one example, memory cells 110 are read when controller 120 is performing a read operation. In one example, cell C of FIG. 3 is read.

At block 603, a read status is determined for the first memory cells. In one example, controller 120 determines a read status for one or more of memory cells 112 (e.g., cells in an MU). In one example, cell C of FIG. 3 is determined to exhibit a read error.

At block 605, the first memory cells are refreshed based on the read status. In one example, cell C of FIG. 3 is refreshed in response to identifying the read error. In one example, cell C is refreshed using an on-demand scrub triggered by identifying the read error (e.g., block 508 of FIG. 5).

At block 607, physical addresses of second memory cells are determined based on physical addresses of the first memory cells (e.g., using an offset mapping table). In one example, a controller uses a physical address of cell C of FIG. 4 to determine physical addresses for one or more of cells V1-V8 as shown in FIG. 4.

At block 609, errors associated with the first memory cells are determined. In one example, cell C of FIG. 3 or FIG. 4 is identified as having one or more zero-to-one failures. In one example, cell C is in a memory unit (MU) for which the read status indicates one or more zero-to-one failures.

At block 611, in response to determining that the errors exceed a threshold, a write refresh is applied to the second memory cells. In one example, cell C of FIG. 4 (or an MU that contains cell C) is identified as having a number of zero-to-one failures that exceed a threshold criterion (e.g., a moving average number of failures for an MU that exceeds a threshold number). In one example, the threshold criterion is a function of temperature, as illustrated in block 522 of FIG. 5.

In response to the failures exceeding the threshold criterion, a write refresh is applied to neighboring cells or MUs. In one example, the neighboring cells are cells V1-V8 of FIG. 4. In one example, a write refresh of block 524 of FIG. 5 is applied.

In one embodiment, a system comprises: a memory array (e.g., 102) comprising at least one first memory cell (e.g., 110); and a controller (e.g., 120) configured to: read the first memory cell; determine a read status for the first memory cell; in response to determining the read status, refresh the first memory cell; determine errors associated with the first memory cell; determine, based on the errors, whether at least one criterion is satisfied; and in response to determining that the criterion is satisfied: determine a physical address of at least one second memory cell using at least one offset from a physical address of the first memory cell; and apply a write refresh to the second memory cell.

In one embodiment, the at least one first memory cell is: an individual memory cell; or a plurality of cells associated with a memory unit of the memory array.

In one embodiment, the second memory cell is on a same wordline as the first memory cell, or is on a same bitline as the first memory cell.

In one embodiment, the controller is further configured to determine at least one temperature associated with the memory array, and wherein the criterion is adjusted based on the temperature.

In one embodiment, the at least one offset comprises a bitline offset and a wordline offset.

In one embodiment, the at least one offset is determined by at least one of adding or subtracting a respective first value to or from a bitline number for each first memory cell, or adding or subtracting a respective second value to a wordline number for each first memory cell. In one example, the offsets are determined according to the mapping of FIG. 4.

In one embodiment, each of the respective first and second values has a value of 1 or 2.

In one embodiment, the at least one criterion includes a first threshold and a second threshold; the at least one second memory cell is a first set of cells when a number of the errors exceeds the first threshold; the at least one second memory cell is a second set of cells when the number of the errors exceeds the second threshold; the second threshold is greater than the first threshold; and the second set is larger than the first set.

In one embodiment, the controller is further configured to: determine a temperature; and adjust the at least one criterion based on the determined temperature.

In one embodiment, the temperature is a temperature of a semiconductor die on which the memory array is formed.

In one embodiment, the criterion is a threshold, and the threshold is a function of temperature.

In one embodiment, the errors are zero-to-one failures.

In one embodiment, the memory array is a cross-point memory array.

In one embodiment, the first memory cell and the second memory cell are each programmable by the controller to be in an amorphous state or a crystalline state.

In one embodiment, an apparatus comprises: a memory array comprising at least one first memory cell; at least one sensor (e.g., 111, 113, 115); and a controller configured to: read the first memory cell; determine a read status for the first memory cell; in response to determining the read status, refresh the first memory cell; determine errors associated with the first memory cell; collect sensor data from the at least one sensor; determine, based on the sensor data, at least one criterion; determine, based on the errors, whether the at least one criterion is satisfied; and in response to determining that the criterion is satisfied: determine a physical address of at least one second memory cell based on a physical address of the first memory cell; and apply a write refresh to the second memory cell.

In one embodiment, the sensor is a temperature sensor.

In one embodiment, the sensor data is temperature data, the criterion is a threshold, and the threshold is reduced by the controller in response to determining, using the temperature data, that a temperature associated with the memory array has increased.

In one embodiment, the physical address of the second memory cell is determined using at least one offset from the physical address of the first memory cell.

In one embodiment, the read status is a read error due to failure to decode data read from the memory array, and the first memory cell is refreshed in response to determining the read error.

In one embodiment, a method comprises: reading first memory cells; determining a read status for the first memory cells; based on the read status, refreshing the first memory cells; determining respective physical addresses of second memory cells based on physical addresses of the first memory cells; determining errors associated with the first memory cells; and in response to determining that the errors exceed at least one threshold, applying a write refresh to the second memory cells.

In one embodiment, the method further comprises adjusting the threshold based on a temperature associated with the memory array. In one example, the temperature is based on data collected by sensor 111 and/or 113.

In one embodiment, the errors are compared to a first threshold (e.g., a lower threshold) and a second threshold (e.g., a higher threshold); a first number of second memory cells (e.g., 2 cells) is refreshed in response to determining that the errors exceed the first threshold; and a second number (e.g., 8 cells) the second memory cells is refreshed in response to determining that the errors exceed the second threshold.

The disclosure includes various devices which perform the methods and implement the systems described above, including data processing systems which perform these methods, and computer-readable media containing instructions which when executed on data processing systems cause the systems to perform these methods.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In this description, various functions and/or operations may be described as being performed by or caused by software code to simplify description. However, those skilled in the art will recognize what is meant by such expressions is that the functions and/or operations result from execution of the code by one or more processing devices, such as a microprocessor, Application-Specific Integrated Circuit (ASIC), graphics processor, and/or a Field-Programmable Gate Array (FPGA). Alternatively, or in combination, the functions and operations can be implemented using special purpose circuitry (e.g., logic circuitry), with or without software instructions. Embodiments can be implemented using hardwired circuitry without software instructions, or in combination with software instructions. Thus, the techniques are not limited to any specific combination of hardware circuitry and software, nor to any particular source for the instructions executed by a computing device.

While some embodiments can be implemented in fully functioning computers and computer systems, various embodiments are capable of being distributed as a computing product in a variety of forms and are capable of being applied regardless of the particular type of computer-readable medium used to actually effect the distribution.

At least some aspects disclosed can be embodied, at least in part, in software. That is, the techniques may be carried out in a computing device or other system in response to its processing device, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions (sometimes referred to as computer programs). Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A computer-readable medium can be used to store software and data which when executed by a computing device causes the device to perform various methods. The executable software and data may be stored in various places including, for example, ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a computer-readable medium in entirety at a particular instance of time.

Examples of computer-readable media include, but are not limited to, recordable and non-recordable type media such as volatile and non-volatile memory devices, read only memory (ROM), random access memory (RAM), flash memory devices, solid-state drive storage media, removable disks, magnetic disk storage media, optical storage media (e.g., Compact Disk Read-Only Memory (CD ROMs), Digital Versatile Disks (DVDs), etc.), among others. The computer-readable media may store the instructions. Other examples of computer-readable media include, but are not limited to, non-volatile embedded devices using NOR flash or NAND flash architectures. Media used in these architectures may include un-managed NAND devices and/or managed NAND devices, including, for example, eMMC, SD, CF, UFS, and SSD.

In general, a non-transitory computer-readable medium includes any mechanism that provides (e.g., stores) information in a form accessible by a computing device (e.g., a computer, mobile device, network device, personal digital assistant, manufacturing tool having a controller, any device with a set of one or more processors, etc.). A "computer-readable medium" as used herein may include a single medium or multiple media (e.g., that store one or more sets of instructions).

In various embodiments, hardwired circuitry may be used in combination with software and firmware instructions to implement the techniques. Thus, the techniques are neither limited to any specific combination of hardware circuitry and software nor to any particular source for the instructions executed by a computing device.

Various embodiments set forth herein can be implemented using a wide variety of different types of computing devices. As used herein, examples of a "computing device" include, but are not limited to, a server, a centralized computing platform, a system of multiple computing processors and/or components, a mobile device, a user terminal, a vehicle, a personal communications device, a wearable digital device, an electronic kiosk, a general purpose computer, an electronic document reader, a tablet, a laptop computer, a smartphone, a digital camera, a residential domestic appliance, a television, or a digital music player. Additional examples of computing devices include devices that are part of what is called "the internet of things" (IOT). Such "things" may have occasional interactions with their owners or administrators, who may monitor the things or modify settings on these things. In some cases, such owners or administrators play the role of users with respect to the "thing" devices. In some examples, the primary mobile device (e.g., an Apple Phone) of a user may be an administrator server with respect to a paired "thing" device that is worn by the user (e.g., an Apple watch).

In some embodiments, the computing device can be a computer or host system, which is implemented, for example, as a desktop computer, laptop computer, network server, mobile device, or other computing device that includes a memory and a processing device. The host system can include or be coupled to a memory sub-system so that the host system can read data from or write data to the memory sub-system. The host system can be coupled to the memory sub-system via a physical host interface. In general, the host system can access multiple memory sub-systems via a same communication connection, multiple separate communication connections, and/or a combination of communication connections.

In some embodiments, the computing device is a system including one or more processing devices. Examples of the processing device can include a microcontroller, a central processing unit (CPU), special purpose logic circuitry (e.g., a field programmable gate array (FPGA), an application specific integrated circuit (ASIC), etc.), a system on a chip (SoC), or another suitable processor.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A system comprising:
   a memory array comprising at least one first memory cell; and
   a controller configured to:
      read the first memory cell;
      determine a read status for the first memory cell;
      in response to determining the read status, refresh the first memory cell;
      determine errors associated with the first memory cell;
      determine, based on the errors, whether at least one criterion is satisfied; and
      in response to determining that the criterion is satisfied:
         determine a physical address of at least one second memory cell using at least one offset from a physical address of the first memory cell; and
         apply a write refresh to the second memory cell.

2. The system of claim 1, wherein the at least one first memory cell is:
   an individual memory cell; or
   a plurality of cells associated with a memory unit of the memory array.

3. The system of claim 1, wherein the second memory cell is on a same wordline as the first memory cell, or is on a same bitline as the first memory cell.

4. The system of claim 1, wherein the controller is further configured to determine at least one temperature associated with the memory array, and wherein the criterion is adjusted based on the temperature.

5. The system of claim 1, wherein the at least one offset comprises a bitline offset and a wordline offset.

6. The system of claim 1, wherein the at least one offset is determined by at least one of adding or subtracting a respective first value to or from a bitline number for each first memory cell, or adding or subtracting a respective second value to a wordline number for each first memory cell.

7. The system of claim 6, wherein each of the respective first and second values has a value of 1 or 2.

8. The system of claim 1, wherein:
   the at least one criterion includes a first threshold and a second threshold;
   the at least one second memory cell is a first set of cells when a number of the errors exceeds the first threshold;
   the at least one second memory cell is a second set of cells when the number of the errors exceeds the second threshold;
   the second threshold is greater than the first threshold; and
   the second set is larger than the first set.

9. The system of claim 1, wherein the controller is further configured to:
   determine a temperature; and
   adjust the at least one criterion based on the determined temperature.

10. The system of claim 9, wherein the temperature is a temperature of a semiconductor die on which the memory array is formed.

11. The system of claim 9, wherein the criterion is a threshold, and the threshold is a function of temperature.

12. The system of claim 1, wherein the errors are zero-to-one failures.

13. The system of claim 1, wherein the memory array is a cross-point memory array.

14. The system of claim 1, wherein the first memory cell and the second memory cell are each programmable by the controller to be in an amorphous state or a crystalline state.

15. An apparatus comprising:
   a memory array comprising at least one first memory cell;
   at least one sensor; and
   a controller configured to:
      read the first memory cell;
      determine a read status for the first memory cell;
      in response to determining the read status, refresh the first memory cell;
      determine errors associated with the first memory cell;
      collect sensor data from the at least one sensor;
      determine, based on the sensor data, at least one criterion;
      determine, based on the errors, whether the at least one criterion is satisfied; and
      in response to determining that the criterion is satisfied:
         determine a physical address of at least one second memory cell based on a physical address of the first memory cell; and
         apply a write refresh to the second memory cell.

16. The apparatus of claim 15, wherein the sensor is a temperature sensor.

17. The apparatus of claim 15, wherein the sensor data is temperature data, the criterion is a threshold, and the threshold is reduced by the controller in response to determining, using the temperature data, that a temperature associated with the memory array has increased.

18. The apparatus of claim 15, wherein the physical address of the second memory cell is determined using at least one offset from the physical address of the first memory cell.

19. The apparatus of claim 15, wherein the read status is a read error due to failure to decode data read from the memory array, and the first memory cell is refreshed in response to determining the read error.

20. A method comprising:
   reading first memory cells;
   determining a read status for the first memory cells;
   based on the read status, refreshing the first memory cells;
   determining respective physical addresses of second memory cells based on physical addresses of the first memory cells;
   determining errors associated with the first memory cells; and
   in response to determining that the errors exceed at least one threshold, applying a write refresh to the second memory cells.

21. The method of claim 20, further comprising adjusting the threshold based on a temperature associated with the memory array.

22. The method of claim 20, wherein:
   the errors are compared to a first threshold and a second threshold;
   a first number of second memory cells is refreshed in response to determining that the errors exceed the first threshold; and a second number of the second memory cells is refreshed in response to determining that the errors exceed the second threshold.

* * * * *